United States Patent
Franke

(10) Patent No.: US 6,853,665 B2
(45) Date of Patent: Feb. 8, 2005

(54) PHOTODIODE CONFIGURATION HAVING TWO PHOTODIODES, A LASER DIODE CONFIGURATION HAVING THE PHOTODIODE CONFIGURATION, AND METHOD FOR CONNECTING THE PHOTODIODE CONFIGURATION TO A SUBSTRATE

(75) Inventor: Martin Franke, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/218,942

(22) Filed: Aug. 14, 2002

(65) Prior Publication Data

US 2003/0035457 A1 Feb. 20, 2003

Related U.S. Application Data

(63) Continuation of application No. PCT/DE01/03069, filed on Aug. 14, 2001.

(51) Int. Cl.[7] .................................................. H01S 5/00

(52) U.S. Cl. ................................................ 372/50; 372/43

(58) Field of Search .............................. 372/50, 43, 47, 372/48, 31, 54, 29.01, 29.02, 36.5, 59; 385/14; 347/238; 398/182

(56) References Cited

U.S. PATENT DOCUMENTS

| | | | |
|---|---|---|---|
| 5,005,178 A | * | 4/1991 | Kluitmans et al. ............. 372/36 |
| 5,148,504 A | * | 9/1992 | Levi et al. ..................... 385/14 |
| 5,917,534 A | * | 6/1999 | Rajeswaran .................. 347/238 |
| 5,949,064 A | | 9/1999 | Chow et al. |
| 6,037,644 A | | 3/2000 | Daghighian et al. |
| 6,250,820 B1 | | 6/2001 | Melchior et al. |
| 6,541,794 B1 | * | 4/2003 | Patterson et al. ............. 257/59 |
| 6,612,757 B1 | * | 9/2003 | Staudemeyer et al. ...... 398/182 |

FOREIGN PATENT DOCUMENTS

| | | |
|---|---|---|
| DE | 197 09 842 C1 | 10/1998 |
| GB | 2 246 662 A | 2/1992 |

* cited by examiner

Primary Examiner—Don Wong
Assistant Examiner—Tuan Nguyen
(74) Attorney, Agent, or Firm—Laurence A. Greenberg; Werner H. Stemer; Gregory L. Mayback

(57) ABSTRACT

A photodiode configuration having at least two photodiodes is described. Accordingly, the photodiodes are formed in a symmetrical configuration on a common carrier, and electrical contacts are situated in a region between the photodiodes. It is therefore possible, in particular, to use monitor diode configurations of identical construction at the two sides of a laser diode array. Accordingly, a laser diode configuration having a correspondingly configuration having a photodiode configuration is further disclosed. Finally, a method for connecting a photodiode configuration to a submount is specified.

8 Claims, 6 Drawing Sheets

PHOTODIODE CONFIGURATION HAVING TWO PHOTODIODES, A LASER DIODE CONFIGURATION HAVING THE PHOTODIODE CONFIGURATION, AND METHOD FOR CONNECTING THE PHOTODIODE CONFIGURATION TO A SUBSTRATE

This application is a continuation of copending International Application No. PCT/DE01/03069, filed Aug. 14, 2001, which designated the United States and was not published in English.

BACKGROUND OF THE INVENTION

Field of the Invention

The invention relates to a photodiode configuration having two photodiodes, a laser diode configuration having such a photodiode configuration, and a method for connecting a photodiode configuration to a substrate.

German Patent DE 197 09 842 C1 discloses an electro-optical coupling assembly with a laser diode configuration in which a plurality of vertically emitting VCSEL laser diodes are disposed in an array. The laser diodes are assigned optical waveguides which are disposed in one plane and whose coupling-side end faces effect beam deflection of the light emitted by the laser diodes into the optical waveguides.

It is known, in the case of such laser diode configurations, to provide one or more monitor diodes via which the laser diode configuration is monitored and controlled.

Known laser diode configurations are formed of a laser diode array containing sixteen VCSEL diodes disposed on a submount. Twelve of the laser diodes serve for data communication and they are accordingly assigned in each case to an optical waveguide. Two laser diodes situated at an edge of the array are respectively assigned a monitor diode, whose light-sensitive area is positioned directly above the respective outermost laser diode.

The monitor diode is respectively formed in a carrier that is fixed to a submount serving as a spacer element or spacer.

The monitor diodes and also the laser diodes are contact-connected via bonding wires, which are connected via metalizations and further bonding wires to contacts of a control and driver circuit.

The two monitor diodes are usually used in such a way that the optical output power of the laser diodes is regulated with the aid of one monitor diode, while the other laser diode effects a safety shutdown for the case where the laser power exceeds a predetermined limit value. Such instances of regulation are known per se.

What is disadvantageous about the known configuration of the monitor diodes is that complicated and expensive individual productions that are disposed on the respective submount are involved. Automated production has not been possible heretofore.

SUMMARY OF THE INVENTION

It is accordingly an object of the invention to provide a photodiode configuration having two photodiodes, a laser diode configuration having the photodiode configuration, and a method for connecting the photodiode configuration to a substrate that overcome the above-mentioned disadvantages of the prior art devices and methods of this general type, which allows production using standard processes and, at the same time, provides a simple configuration that can be used in many ways.

With the foregoing and other objects in view there is provided, in accordance with the invention, a photodiode configuration. The photodiode configuration contains a common carrier, at least two photodiodes formed in a symmetrical configuration on the common carrier, and electrical contacts disposed in a region between the photodiodes.

Accordingly, a solution according to the invention is distinguished by the fact that at least two photodiodes are formed in a symmetrical configuration on a common carrier, the electrical contacts being situated in the region between the photodiodes.

The use of a symmetrical configuration with at least two photodiodes has the advantage, on account of the symmetry present, that the photodiodes can be used in many ways, if appropriate only one of the photodiodes in each case actually being used for light detection. In particular, the solution according to the invention makes it possible to use the same photodiode configuration at opposite sides of a laser diode array without further modification.

On account of the symmetrical configuration, simplified mounting of the photodiode configuration in a manner based on standard processes is also possible. In particular, a standard flip-chip process is possible for connecting the photodiode configuration to a submount. Finally, the solution according to the invention has the advantage that the diversity of parts is reduced on account of the diverse usability of the photodiode configuration.

In a preferred refinement of the invention, the contacts for the photodiodes are provided with soldering bumps for flip-chip connections. In this case, the carrier is preferably a silicon carrier with electrical contacts made of aluminum. The carrier is provided with a passivation layer.

In a preferred embodiment, the photodiode configuration is fixed on the submount via which the photodiodes are electrically contact-connected. In this case, the submount and the photodiode carrier are preferably formed in rectangular fashion and disposed in a crossed or T-shaped configuration perpendicularly to one another. The photodiodes are situated laterally with respect to the crossover region with the submount and on opposite sides of the crossover region. They are disposed to an extent at the ends of the crossbar of the "T".

In this case, the submount is preferably connected to the photodiode carrier upside down via flip-chip interconnects. Connection by the known flip-chip technology makes it possible to have recourse to tried and tested, standardized contact-connection methods. The central connection of the submount to the photodiode carrier ensures that the laterally disposed photodiodes can detect light in an undisturbed manner.

With the foregoing and other objects in view there is further provided, in accordance with the invention, a laser diode configuration. The laser diode configuration contains a monitoring and control unit, a plurality of laser diodes disposed in an array and can each be optically coupled to an optical waveguide, and at least one monitor diode in each case optically coupled to one of the laser diodes and connected to the monitoring and control unit for controlling the laser diodes. The monitor diode being the photodiode configuration described above.

The laser diode configuration according to the invention is distinguished by the fact that the at least one monitor diode is in each case provided by the photodiode configuration as mentioned above. The configuration is such that in each case one of the photodiodes of a photodiode configuration is assigned to an outer laser diode of the laser diode array. The other photodiode is not actively used. Although it is thus superfluous, the solution according to the invention nonetheless has the advantage that the same photodiode configuration can also be used on the other side of the laser diode array without the need for any modifications.

The laser diode array is preferably an array containing VCSEL lasers. In this case, the photodiode configuration is disposed laterally with respect to the laser diode array in such a way that a respective photodiode of the photodiode configuration is situated above the assigned lateral laser diode. The submount for the photodiode configuration serves as a spacer element or spacer in this case. The photodiode configuration and the associated submount preferably form a T configuration in each case, the photodiode that is actively used as a monitor diode being disposed at one end of the transverse arm of the T configuration.

It is pointed out that an array of laser diodes is understood to mean an arbitrary configuration of a plurality of laser diodes in series. In this case, laser diodes need not necessarily be formed together in a submount. It is equally possible for a plurality of individual submounts each with a laser diode to be disposed in series.

With the foregoing and other objects in view there is additionally provided, in accordance with the invention, a method for connecting a photodiode configuration. The method includes providing a multiplicity of submounts having contacts in a work-piece carrier, and providing a multiplicity of photodiode configurations each having a common carrier, at least two photodiodes formed in a symmetrical configuration on the common carrier, and electrical contacts disposed in a region between the photodiodes. The electrical contacts of the photodiodes each being provided with soldering bumps. A flip-chip connection is formed between the submounts and the photodiode configurations. The submounts and the photodiode configurations, in the work-piece carrier, in each case being disposed in a crossed manner with respect to one another. A reflow soldering step is performed. An underfill method for filling regions between the soldering bumps is then performed. Finally, finished connected units are each formed of one of the submounts and one of the photodiode configurations in the work-piece carrier are provided.

The method according to the invention is thus distinguished by the fact that the connection of the respective photodiode configurations and submounts is effected after singulation of the respective wafers for the submount and for the photodiodes. In particular, the photodiode, after production using planar technology on a wafer, is first provided with soldering bumps for the flip-chip connections envisaged, is then singulated by sawing into individual units and only then is connected in a T-shaped configuration to a respectively assigned submount in a flip-chip process.

Other features which are considered as characteristic for the invention are set forth in the appended claims.

Although the invention is illustrated and described herein as embodied in a photodiode configuration having two photodiodes, a laser diode configuration having the photodiode configuration, and method for connecting the photodiode configuration to a substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 8:
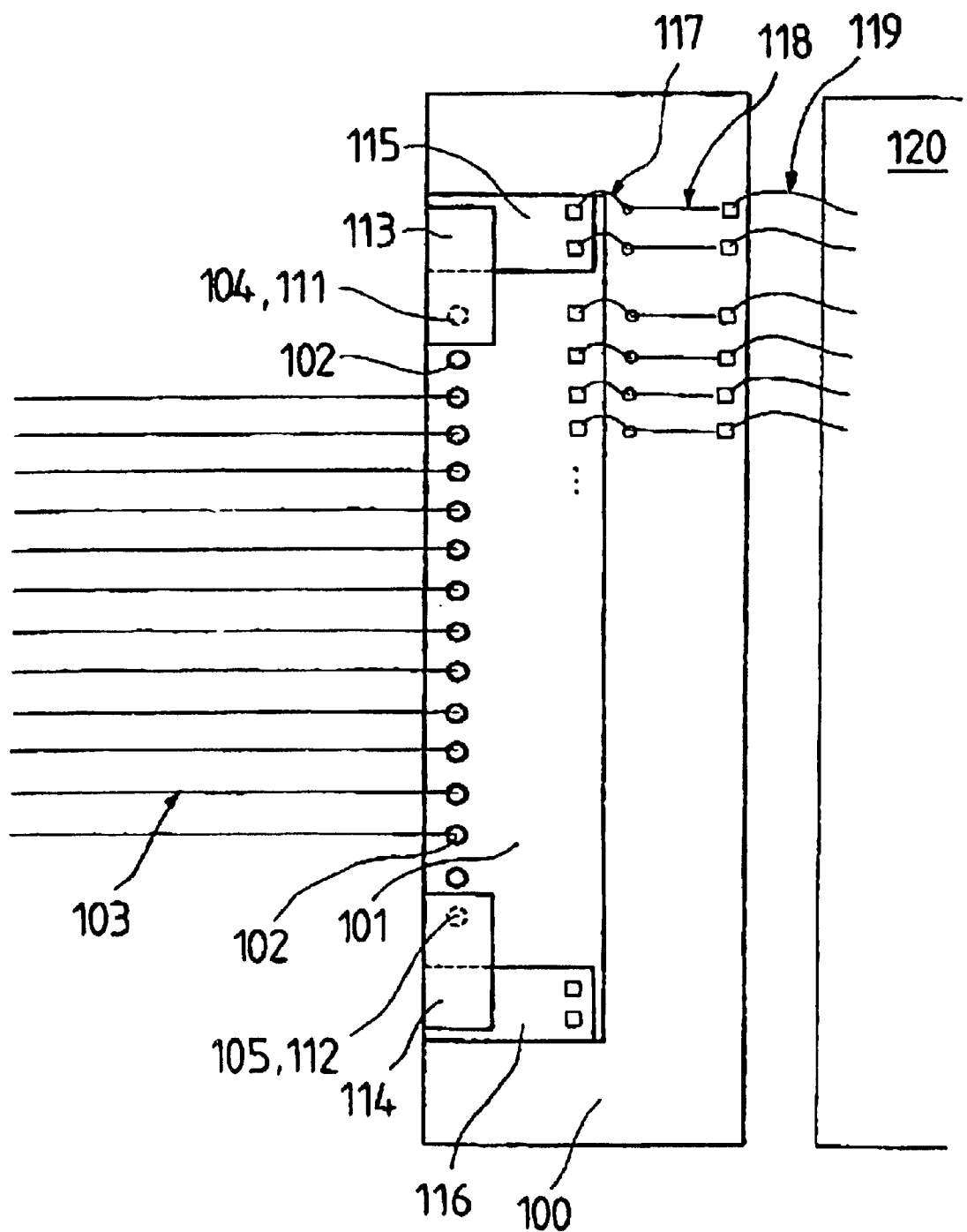
FIG. 8 is a plan view of the laser diode configuration according to the prior art.

Referring now to the figures of the drawing in detail and first, particularly, to FIG. 8 thereof, there is shown a known laser diode configuration. The laser diode configuration contains a laser diode array 101 having sixteen VCSEL diodes 102 disposed on a submount 100. Twelve of the laser diodes 102 serve for data communication and they are accordingly assigned in each case a diagrammatically illustrated optical waveguide 103. Two laser diodes 104, 105 situated at an edge of the array 101 are respectively assigned a monitor diode 111, 112, whose light-sensitive area is positioned directly above the respective outermost laser diode 104, 105.

The monitor diode 111, 112 is respectively formed in a carrier 113, 114, which is fixed to a submount 115, 116 serving as a spacer element or spacer.

The monitor diodes 111, 112 and also the laser diodes 102, 104, 105 are contact-connected via bonding wires 117, which are connected via metalizations 118 and further bonding wires 119 to contacts of a diagrammatically illustrated control and driver circuit 120.

The two monitor diodes 111, 112 are usually used in such a way that the optical output power of the laser diodes 102 is regulated with the aid of one monitor diode 111, while the other laser diode 112 effects a safety shutdown for the case where the laser power exceeds a predetermined limit value. Such instances of regulation are known per se.

Figure 1:
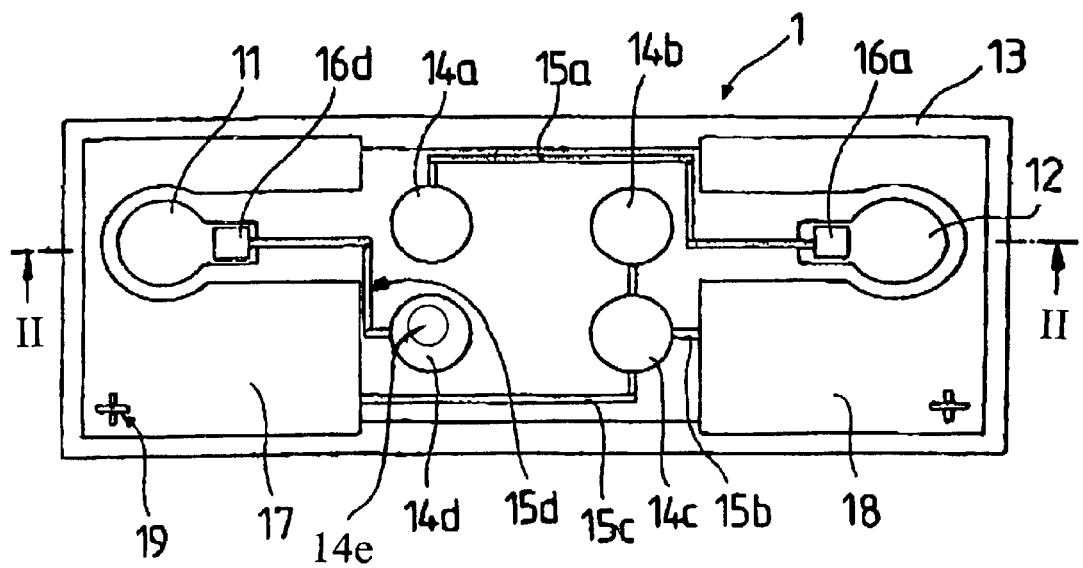
FIG. 1 is a diagrammatic, plan view of a photodiode configuration according to the invention.

FIG. 1 shows a photodiode configuration 1 according to the invention. The photodiode configuration 1 has two photodiodes with photosensitive regions 11, 12. The photodiodes are usually used as monitor diodes in an optoelectronic transmitting device. The photodiodes—consequently also referred to as monitor diodes below—are formed in a carrier 13, as will be explained in more detail with reference to FIG. 2. The photodiode configuration has four central contact areas 14a, 14b, 14c, 14d, on each of which a soldering bump 14e is provided for the purpose of flip-chip mounting on a submount 3 (see FIG. 3).

The two left-hand contact areas 14a, 14d are respectively connected via metalizations 15a, 15d to a contact area 16a, 16d, which is connected to the positively doped region of the semiconductor diode. The two right-hand contact areas 14b, 14c are respectively connected via lines 15b, 15c to negatively doped regions 17, 18 of the semiconductor diodes. So-called marking elements or fiducials 19 serve for lining the photodiode carrier 13 relative to the submount (see FIG. 3) or other aligning elements.

Figure 2A:
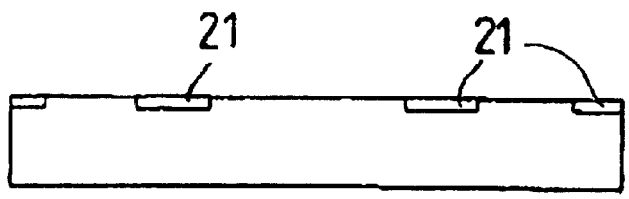
FIGS. 2A–2F are sectional views taken along the line II—II shown in FIG. 1, showing method steps for producing the photodiode configuration.
Figure 2B:
Figure 2C:
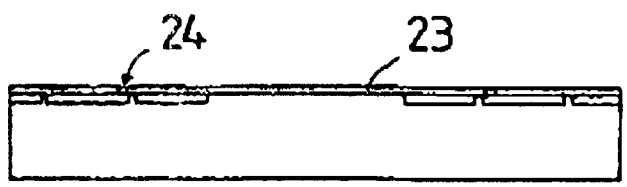

The production of the photodiode configuration of FIG. 1 is illustrated diagrammatically in FIGS. 2A–2F. Accordingly, in a first step, first an n+-type implantation is performed into a silicon carrier in regions 21 (FIG. 2A). This is followed by a p+-type implantation in regions 22 (FIG. 2B). A mask 23 is then applied to the surface, the mask 23 having openings 24 for contact holes for the p-type contact (FIG. 2C).

Figure 2D:
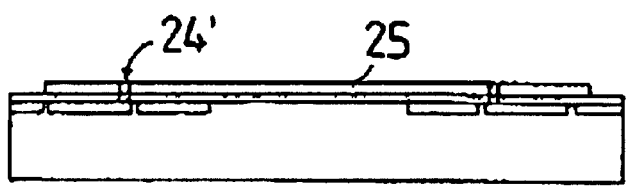
Figure 2E:
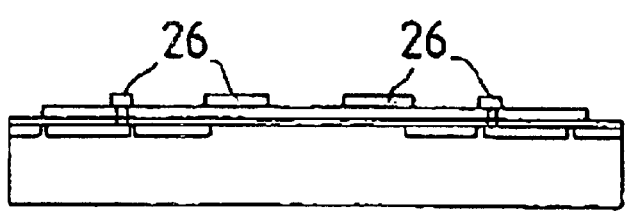
Figure 2F:
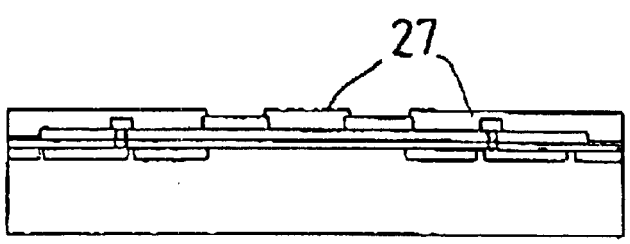

There follows, in FIG. 2D, a passivation with a nitride layer 25, which likewise has openings 24' for contact holes for the p-type contact. Electrical contacts 26 having a thickness of preferably 1.4 $\mu$m are subsequently provided, the contacts 26 being composed of aluminum (FIG. 2E). Finally, a passivation is effected for example by an oxide layer 27 having a thickness of 1 $\mu$m.

When light is incident on the pn junction of the photodiodes, charge carriers are liberated and extracted from the region. A liberated current or a corresponding voltage is detected via the contacts 14a–14d of FIG. 1.

Figure 3:
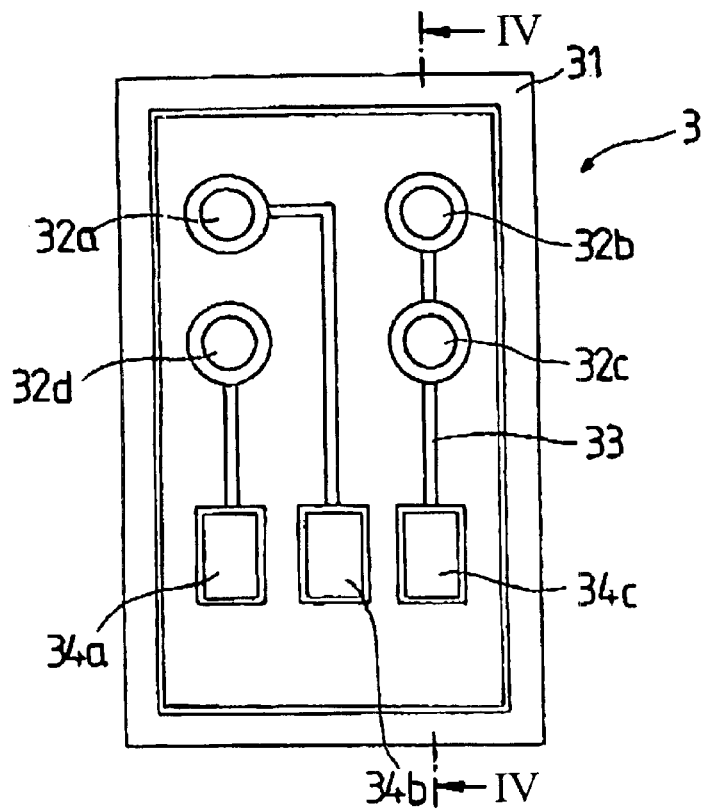
FIG. 3 is a plan view of a submount for connecting to the photodiode configuration in accordance with FIG. 1.

FIG. 3 shows the submount 3 for the contact connection of the photodiode configuration 1 in accordance with FIG. 1. The submount 3 has, on a carrier 31, four contact areas 32a, 32b, 32c, 32d, which are connected to contact pads 34a, 34b, 34c via lines 33. The contact pads 34a, 34b, 34c are connected to a non-illustrated evaluation circuit via non-illustrated bonding wires.

Figure 4A:
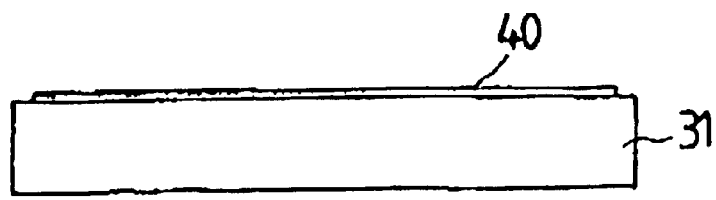
FIGS. 4A–4D are sectional views taken along the line IV—IV shown in FIG. 3 for describing method steps for producing the submount in accordance with FIG. 3.
Figure 4B:
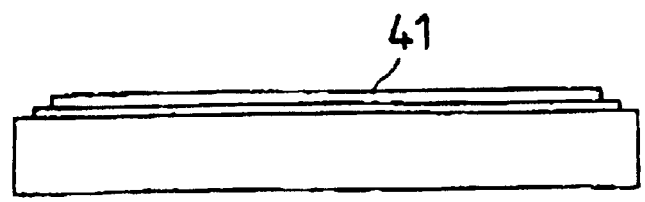
Figure 4C:
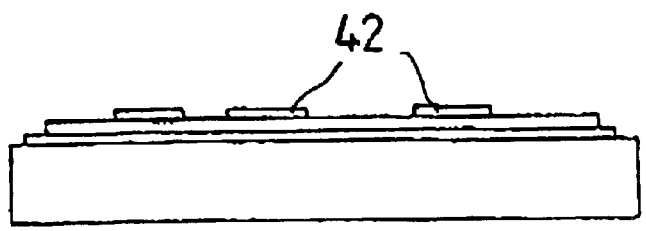
Figure 4D:
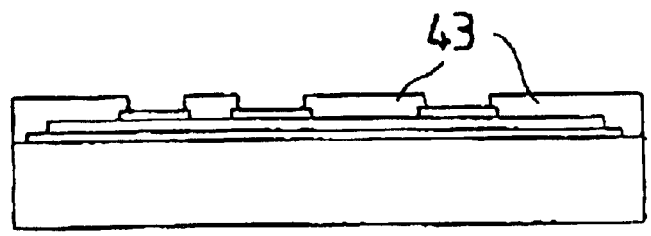

The process sequence for producing the submount 3 shown in FIG. 3 is illustrated in FIGS. 4A–4D. Accordingly, the carrier 31 is first provided with an oxide layer 40 (FIG. 4A). Afterward, a nitride layer 41 is applied for passivation purposes (FIG. 4B). Contact areas 42 made of metal, in particular made of aluminum, are subsequently provided (FIG. 4C) and, finally, a passivation layer is provided, e.g. an oxide layer 43 having a thickness of 1 $\mu$m is provided.

It is directly evident from FIGS. 1 and 3 that in the case of T-shaped provision of the photodiode configuration 1 in accordance with FIG. 1 on the submount 3 of FIG. 3, the respective contact areas 14a to 14d and 32a to 32d come into contact with one another. This is affected via soldering pads and are provided on the contact areas of the photodiode configuration 1. In this case, a flip-chip method is used for connecting the photodiode configuration 1 and the submount 3.

In this case, the contact pads 34a, 34b of FIG. 3 serve for tapping off the photodiode current of the respective photodiodes 11, 12. The third contact pad 34c is put at a fixed, negative potential. If the current of the individual photodiodes 11, 12 is not intended or does not need to be evaluated individually, the central contact pad 34b can also be dispensed with, in which case the left-hand contacts 32a, 32d of the submount 3 would have to be connected to one another.

Figure 5:
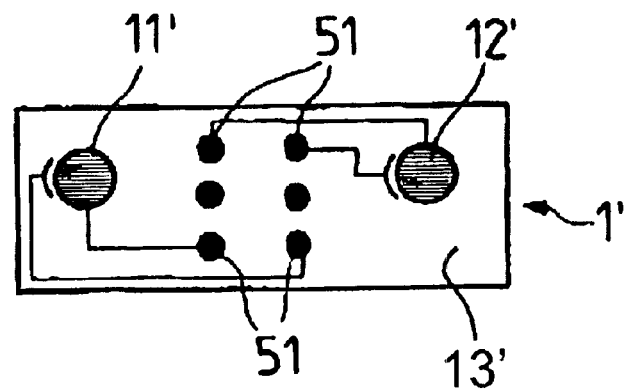
FIG. 5 is a plan view of an alternative exemplary embodiment of the photodiode configuration.

FIG. 5 shows an alternative configuration of a photodiode configuration 1' according to the invention having photodiodes 11', 12' that are likewise disposed symmetrically on a rectangular carrier 13' (strictly speaking the photosensitive regions 11', 12' of the photodiodes are illustrated; however, the discussion will refer to photodiodes for simplification). A plurality of contact areas with soldering bumps 51 are disposed between the two photodiodes 11', 12', in accordance with FIG. 5 only the two upper and lower soldering bumps 51 being used for electrical contact connection. The central soldering bumps 51 are not electrically connected and serve solely for better, more stable connection of the photodiode configuration and the submount.

Figure 6:
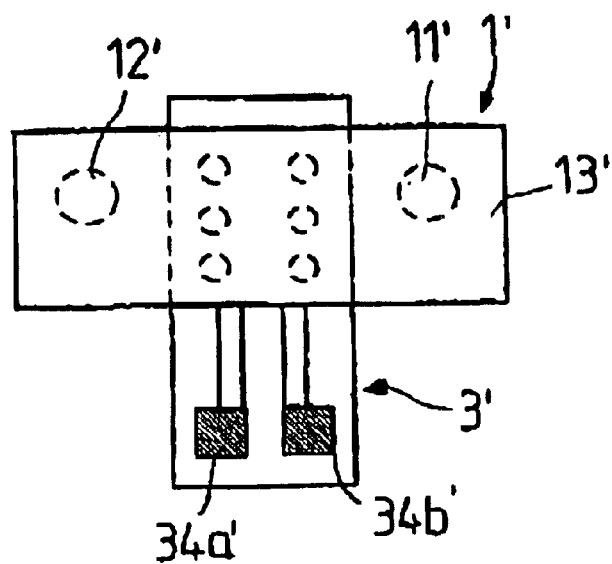
FIG. 6 is a plan view showing a connection of the photodiode configuration of FIG. 5 to a submount having a T configuration.

FIG. 6 shows a T-shaped connection of the photodiode configuration 1' of FIG. 5 on a rectangular submount 3' with two contact pads 34a', 34b', via which the photodiodes 11', 12' are electrically contact-connected. On account of the flip-chip mounting, the light-sensitive regions 11', 12' of the photodiodes are situated on remote sides of the carrier 13' as is illustrated by the broken lines in FIG. 6. The connection of the photodiode configuration 1, 1' to the submount 3, 3' of FIGS. 1 to 6 is preferably effected according to the following method.

First, the photodiode configuration and the submount are produced on the surface of a wafer using planar technology, a multiplicity of photodiode configurations and submounts being produced simultaneously.

The submounts are singulated by sawing the wafer and the singulated submounts 3, 3' or spacers are preferably provided on a "tape on reel". In this case, the submounts 3, 3' are disposed in a material carrier piece in a predetermined grid.

The monitor diode configuration is provided with soldering bumps while still in the wafer composite and is subsequently singulated by sawing and again preferably provided on a "tape on reel". A flip-chip process is effected, during which the soldering bumps are first provided with a flux in a dip process, the submounts of the work piece carrier are then populated with the individual photodiode configurations (in each case in a T configuration as described) and reflow soldering is then performed. Finally, an "underfill" is affected, during which the interspace between the soldering bumps is filled in order to prevent a fatigue fracture in the region of the soldering bumps, and encapsulation is also effected. The finished units containing the photodiode configuration and the submount in a T configuration are then available in the work piece carrier for "pick and place".

Figure 7:
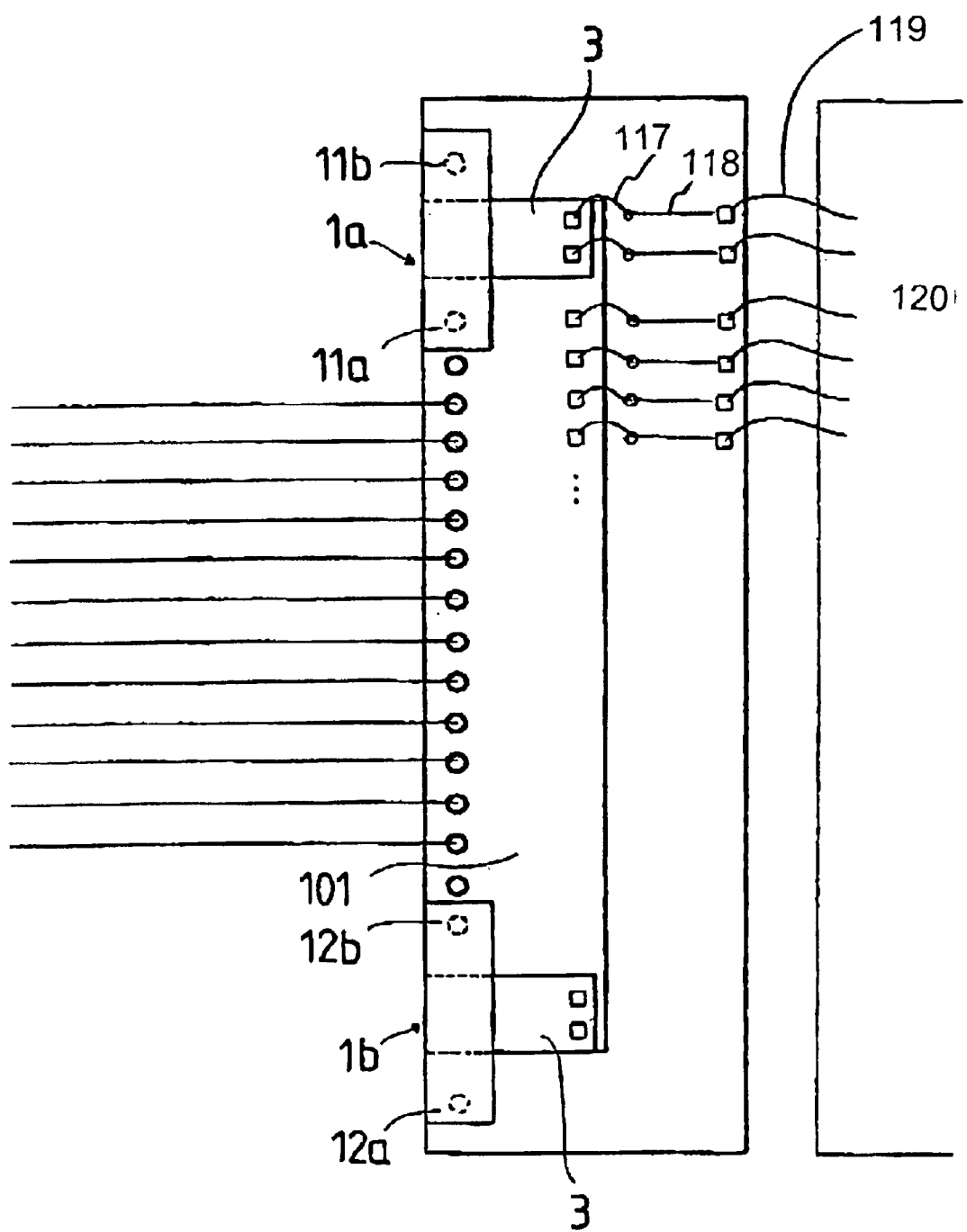
FIG. 7 is a plan view of a laser diode configuration with two photodiode configurations in accordance with FIGS. 1 to 6.

FIG. 7 shows a laser diode configuration in accordance with the laser diode configuration shown in FIG. 8, which was previously described, but the two monitor diodes disposed at ends of the laser diode array 101 are provided by the photodiode configurations 1, 1' which are formed symmetrically with two photodiodes in each case in accordance with FIGS. 1 to 6 and which are fixed in a T-shaped configuration in each case on the submount or spacer 3. The two photodiode configurations 1a, 1b illustrated have identical configurations. A respective photodiode 11a, 12b of the two photodiodes 11a, 11b, 12a, 12b of the photodiode configurations 1a, 1b serves for detecting the light emitted by the associated laser diode.

The embodiment of the invention is not restricted to the exemplary embodiments presented above.

By way of example, it is equally possible to provide photodiode configurations having in each case four or a different number of symmetrically disposed photodiodes. All that is essential is that, in the case of a photodiode configuration having at least two photodiodes, the photodiodes are formed symmetrically with respect to a common carrier and the electrical contacts of the photodiodes are situated in the region between the photodiodes.

I claim:

1. A photodiode configuration, comprising:
   a common carrier having a substrate;
   at least two photodiodes formed in a symmetrical configuration in said substrate of maid common carrier;
   electrical contacts disposed in said substrate of said common carrier in a region between said photodiodes; and
   a submount;
   said photodiodes being electrically contact-connected to said submount;
   said submount and said common carrier being disposed in relation to each other for forming a configuration selected from the group consisting of crossed configurations and T-shaped configurations disposed perpendicularly to one another, said photodiodes being disposed laterally with respect to a crossover region with said submount and on opposite sides of said crossover region.

2. The photodiode configuration according to claim 1, wherein said common carrier is of a rectangular configuration.

3. The photodiode configuration according to claim 1, wherein said common carrier is a silicon carrier having electrical contacts made of aluminum and a passivation layer.

4. The photodiode configuration according to claim 1, wherein said electrical contacts have soldering bumps for flip-chip connections.

5. The photodiode configuration according to claim 1, further comprising flip-chip interconnects for connecting said submount to said common carrier.

6. The photodiode configuration according to claim 1, wherein each of said submount and said common carrier has a rectangular configuration and are disposed in said T-shaped configuration.

7. The photodiode configuration according to claim 1, wherein said submount has at least two bonding pads for contact connection with bonding wires disposed in an area outside of an overlap region with said common carrier.

8. A laser diode configuration, comprising:
   a monitoring and control unit;
   a plurality of VCSEL laser diodes disposed in an array and each to be optically coupled to an optical waveguide;
   at least one monitor diode in each case optically coupled to one of said laser diodes and connected to said monitoring and control unit for controlling said laser diodes, said monitor diode being a photodiode configuration containing:
      a common carrier having a substrate;
      at least two photodiodes formed in a symmetrical configuration in said substrate of said common carrier; and
      electrical contacts disposed in said substrate of said common carrier in a region between said photodiodes;
   said photodiode configuration being disposed laterally with respect to said array for disposing a respective one of said photodiodes of said photodiode configuration above a neighboring one of said VCSEL laser diodes of said array; and
   a submount serving as a spacer element and disposed partially underneath said photodiode configuration;
   said photodiode configuration and said submount forming a T-shaped configuration having opposing arms, and at least one of said photodiodes being located on each of said opposing arms, and one of said photodiodes formed on one of said opposing arms of said T-shaped configuration being disposed above a lateral one of said laser diodes.

* * * * *